United States Patent
Hirai et al.

(10) Patent No.: US 8,130,360 B2
(45) Date of Patent: Mar. 6, 2012

(54) EXPOSURE APPARATUS AND DEVICE MANUFACTURING METHOD

(75) Inventors: Shinichiro Hirai, Saitama (JP); Tetsuya Mori, Utsunomiya (JP); Seiya Miura, Utsunomiya (JP); Yoshinori Ohsaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 680 days.

(21) Appl. No.: 11/835,035

(22) Filed: Aug. 7, 2007

(65) Prior Publication Data

US 2008/0036990 A1 Feb. 14, 2008

(30) Foreign Application Priority Data

Aug. 8, 2006 (JP) .................................. 2006-216261

(51) Int. Cl.
*G03B 27/68* (2006.01)
(52) U.S. Cl. .......................................................... 355/52
(58) Field of Classification Search ........... 356/399–401
See application file for complete search history.

(56) References Cited

U.S. PATENT DOCUMENTS

| | | | | |
|---|---|---|---|---|
| 4,395,117 A | 7/1983 | Suzuki | | 355/43 |
| 5,166,754 A | 11/1992 | Suzuki et al. | | 356/401 |
| 5,309,197 A | 5/1994 | Mori et al. | | 355/53 |
| 5,331,371 A | 7/1994 | Mori et al. | | 355/53 |
| 5,652,657 A | 7/1997 | Yoshii et al. | | 356/394 |
| 5,751,404 A | 5/1998 | Murakami et al. | | 355/53 |
| 6,040,909 A | 3/2000 | Hasegawa et al. | | 356/375 |
| 6,646,714 B2 | 11/2003 | Ohsaki | | 355/52 |
| 6,989,885 B2 | 1/2006 | Osakabe et al. | | 355/53 |
| 2001/0055117 A1 | 12/2001 | Mizutani | | 356/401 |
| 2002/0021433 A1* | 2/2002 | Okita et al. | | 355/55 |
| 2002/0033935 A1* | 3/2002 | Ohsaki | | 355/52 |
| 2003/0193655 A1* | 10/2003 | Ina | | 355/55 |
| 2004/0135981 A1* | 7/2004 | Ina | | 355/55 |
| 2004/0189963 A1* | 9/2004 | Ohsaki | | 355/53 |
| 2005/0128447 A1* | 6/2005 | Shiode | | 355/52 |
| 2005/0128454 A1* | 6/2005 | Ina | | 355/55 |

FOREIGN PATENT DOCUMENTS

| | | |
|---|---|---|
| JP | 2001-015422 | 1/2001 |
| JP | 2001-332490 | 11/2001 |

* cited by examiner

*Primary Examiner* — Edward Glick
*Assistant Examiner* — Deoram Persaud
(74) *Attorney, Agent, or Firm* — Fitzpatrick, Cella, Harper & Scinto

(57) ABSTRACT

An exposure apparatus includes an image sensor, a measurement optical system configured to guide measurement light to obliquely enter the projection optical system, and further, to guide the measurement light returned from the projection optical system to the image sensor, and a control unit configured to calculate surface position information of the substrate based on the output from the image sensor. The control unit calculates the surface position information of the substrate based on an interval between the image, of a mark arranged on the original stage, formed by the measurement light, which has passed through the mark, and the image of the mark formed by the measurement light reflected by the mark.

9 Claims, 15 Drawing Sheets

EXPOSURE APPARATUS AND DEVICE MANUFACTURING METHOD

This application claims the benefit of Japanese Patent Application No. 2006-216261, filed Aug. 8, 2006, which is hereby incorporated by reference herein in its entirety.

BACKGROUND OF THE INVENTION

1. Field of the Invention

The present invention relates to an exposure apparatus suitable for manufacturing a device, such as a semiconductor device, and a device manufacturing method using the same.

2. Description of the Related Art

An exposure apparatus used to manufacture a semiconductor device projects a pattern of an original onto a substrate, coated with a photosensitive agent, via a projection optical system, to expose the photosensitive agent. The exposure apparatus may be of a step and repeat scheme or a step and scan scheme.

FIG. 1 is a view showing a schematic arrangement of an exposure apparatus. The following description is based on an X-Y-Z orthogonal coordinate system shown in FIG. 1. In the exposure apparatus, an original (reticle) R and a substrate (wafer) W are arranged at almost optically conjugate positions via a projection optical system UL. An illumination optical system IL illuminates, of the entire original R, an arcuate area or a slit-like area having a long side in the X direction. An original stage RS and a substrate stage WS are driven at a speed ratio corresponding to the optical magnification of the projection optical system UL in a direction perpendicular to the optical axis (Z-axis) of the projection optical system UL, that is, in the Y direction. The pattern of the original R is transferred onto the substrate W with exposure light emitted by a light source LS.

A control system, which includes a laser interferometer 101 for measuring the position of the original stage RS and an actuator for driving the original stage RS, controls the position of the original stage RS in the Y direction. In addition to the original R, an original reference plate RP is arranged on the original stage RS. The height of the pattern surface of the original reference plate RP almost coincides with that of the original R. A plurality of position measurement marks, made of a metal, such as Cr, are formed on the pattern surface of the original reference plate RP. The original stage RS is driven, while its position in the Z direction is kept constant relative to the projection optical system UL. A moving mirror 102 for reflecting the light beam emerging from the laser interferometer 101 is fixed to the original stage RS. The laser interferometer 101 successively measures the position and amount of movement of the original stage RS. The original stage RS may be one that can be driven not only in the Y direction, but also, in the X and Z directions. In this case, the control system, including the laser interferometer and actuator, controls the position of the original stage RS in the X and Z directions.

A substrate reference plate WP is arranged on the substrate stage WS. The height of the pattern surface of the substrate reference plate WP almost coincides with that of the upper surface of the substrate W. A plurality of position measurement marks, made of a metal, such as Cr, are formed on the pattern surface of the substrate reference plate WP. The control system controls the substrate stage WS to be movable in the Z direction and within the X-Y plane, and to be finely rotatable about the θX-, θY-, and θZ-axes. Similar to the original stage RS, the moving mirror 102 for reflecting the light beam from the laser interferometer 101 is fixed to the substrate stage WS. The laser interferometer 101 successively measures the position of the substrate stage WS in the X, Y, and Z directions, and its amount of movement.

A surface position detector will be explained next. The exposure apparatus comprises a grazing-incidence (oblique-incidence) surface position detector 103 to detect the surface position on the substrate W. The surface position detector 103 includes an illumination unit 103a and a detection unit 103b. The illumination unit 103a emits a plurality of light beams to obliquely illuminate the surface of the substrate W, onto which the pattern of the original R is to be transferred via the projection optical system UL. The detection unit 103b detects the plurality of light beams reflected by the surface of the substrate W. A plurality of photo-receiving elements are arrayed on the detection unit 103b of the surface position detector 103 in one-to-one correspondence with the plurality of light beams. The photo-receiving surface of each photo-receiving element is set to be almost conjugate to the reflection point of the corresponding light beam, on the surface of the substrate W. The surface position detector 103 detects the positional shift of the substrate W in the Z direction as the positional shift of the light beam applied to the photo-receiving element of the detection unit 103b.

The substrate stage WS is driven in the horizontal direction to cause the surface position detector 103 to measure the positional shift of the surface of the substrate W (or substrate reference plate WP) from its measurement origin. This positional shift results from "undulation" or "warp" of the substrate W (or substrate reference plate WP).

Ideally, the focal plane of the projection optical system UL coincides with the measurement origin of the surface position detector 103. In exposure, the substrate stage WS is driven in the Z direction to correct the positional shift of the surface of the substrate W from the measurement origin of the surface position detector 103, that is, the positional shift of the surface of the substrate W from the focal plane of the projection optical system UL. This correction driving allows exposure, while the surface of the substrate W is positioned at a focal plane FP of the projection optical system UL.

However, when the projection optical system UL absorbs heat generated by the exposure light or when the surrounding environment varies, a positional shift occurs between the measurement origin of the grazing-incidence surface position detector 103 and the focal plane of the projection optical system UL. To solve this problem, it is necessary to measure and to correct the positional shift via the projection optical system UL. This correction is called focus calibration. The focus calibration can use an image detection TTR (Through The Reticle) detector.

A TTR detector 104 is an enlargement optical system. One exposure apparatus can incorporate one or a plurality of TTR detectors 104.

The TTR detector 104 can include an illumination unit 105, an objective lens 106, a relay lens 107, an image sensor 108, and a light guide system 109. The light guide system 109 guides exposure light to the illumination unit 105. The light source of the TTR detector 104 need not always use exposure light, but may use non-exposure light. The TTR detector 104 can sense an original reference mark RM and a substrate reference mark WM, and also functions as a position detection means for detecting the relative positions of these reference marks. The detection of these relative positions is used for calculation (X-Y calibration) of the shift between the driving directions of the original stage RS and substrate stage WS. The TTR detector 104 is movable in the X and Y directions to be able to detect the reference mark at each image height of the projection optical system UL.

While being supported by, for example, an air bearing in a noncontact manner, the substrate stage WS moves on its surface plate processed with a very high accuracy in the Z direction. The driving area of the substrate stage WS widens along with an increase in the size of the substrate W. The depth of focus is becoming shallow along with the formation of a finer pattern to be transferred. Therefore, it is becoming more difficult to accurately process the substrate stage surface plate such that the entire driving area of the substrate stage WS satisfies a sufficiently large depth of focus.

A variation in load upon driving the substrate stage WS also deforms the substrate stage surface plate. It is also difficult to process, into a completely flat surface, the reflection surface of the moving mirror 102, referred to by the laser interferometer 101, in order to control the position of the substrate stage WS. Consequently, many moving mirrors 102 mounted in the exposure apparatus have an uneven reflection surface. From a long-term viewpoint, the shape of the reflection surface of the moving mirror 102 changes upon an environmental variation in the exposure apparatus, and also, depending on the held state of the moving mirror 102. For these reasons, even when the substrate stage WS is driven in the horizontal direction, it shifts in the Z direction. This shifts the surface of the substrate W in the Z direction.

Assume, for example, that the surface position detector 103 detects a surface position Zp of the substrate W to correct and to drive the substrate stage WS by an amount of Zp in exposure. Even in this case, a positional shift Zd upon the positional shift of the substrate stage WS deviates the surface position of the substrate W from the best-focus position FP of the projection optical system UL by an amount of Zd. To prevent this problem, it is necessary to reduce a focus error by measuring the positional shift of the substrate stage WS in advance and to correct it in driving the substrate stage WS.

To solve these problems, a conventional exposure apparatus measures the positional shift of the substrate stage WS in the Z direction by arranging two detection areas of the surface position detector 103 in the driving direction of the substrate stage WS. This measurement method will be explained with reference to FIG. 2. The surface position detector 103 includes first and second detectors for respectively measuring the surface positions of the substrate W in the two detection areas along the driving direction of the substrate stage WS. Let Ly be the interval between the two detection areas. The first and second detectors use first and second light beams 103-1 and 103-2, respectively.

The substrate W, generally, has an uneven surface. When the substrate W is located at a position Y=y0, the first detector measures the surface position of the substrate W at a point A with the first light beam 103-1. This measurement value is defined as Zp(y0). Assume that the substrate stage WS is driven in the Y direction by Ly and its coordinate changes from the position Y=y0 to a position Y=y1. The second detector measures the surface position of the substrate W at the point A with the second light beam 103-2. This measurement value is defined as Zp(y1). The first detector using the first light beam 103-1 and the second detector using the second light beam 103-2 detect the same point A. For this reason, these measurement values must be equal, irrespective of the unevenness of the surface of the substrate W. However, assuming that the surface of the substrate W shifts in the focus direction (Z direction) by an amount Zd upon driving the substrate stage WS, the detected measurement value Zp(y1) is shifted by an amount Zd, with respect to the measurement value Zp(y0). That is, we have $$Zp(y1)=Zp(y0)+Zd$$

where Zp(y0) and Zp(y1) are the measurement values obtained by the first and second detectors. The above-described relational expression allows the calculation of the positional shift Zd.

In accordance with the above-described principle, the first and second detectors detect the surface position of the substrate W over its entire surface while driving the substrate stage WS. This makes it possible to measure the positional shift of the substrate stage WS in the Z direction over its entire movable range.

The measurement data thus obtained can be associated with the coordinates of the substrate stage WS and stored in a memory as a correction table. In exposure, the substrate stage WS is corrected and driven using the correction table stored in the memory. This correction driving makes it possible to accurately position the surface of the substrate W at the focal plane FP of the projection optical system UL.

To cope with an increase in the degree of integration of semiconductor devices, a stronger demand has arisen for forming a finer pattern to be transferred onto a substrate, that is, for increasing the resolution. Under the circumstances, the shortening of the exposure wavelength has limitations. These days, in addition to the wavelength shortening, an attempt to meet this demand is made by increasing the numerical aperture (NA) of the projection optical system UL from about the conventional 0.6 to more than 0.9. Moreover, there is proposed a liquid immersion exposure apparatus in which part of the space between the projection optical system UL and the substrate W is filled with a liquid having a refractive index higher than one to increase the NA, thereby forming a finer exposure pattern.

In the liquid immersion exposure apparatus, the space between the substrate W and the optical element, which forms the projection end side (imaging plane side) of the projection optical system UL, is filled with a liquid having a refractive index close to that of the resist layer. This makes it possible to increase an effective NA of the projection optical system UL, when seen from the side of the substrate W, to result in an improvement in resolution. The liquid immersion projection method is expected to achieve good imaging performance by optimally selecting a liquid to be used.

In a high-NA exposure apparatus, it is necessary to arrange the substrate W and a lens (end lens) of the projection optical system UL, which is nearest to the substrate W, adjacent to each other, to suppress an increase in the size of the end lens. A liquid immersion exposure apparatus requires arranging the substrate W and the end lens of the projection optical system UL adjacent to each other, also from the viewpoint of stably holding the liquid between the projection optical system UL and the substrate W. In such an arrangement, it is impossible to arrange the surface position detector 103 around the projection optical system UL, so that the exposure area on the substrate W coincides with the measurement area of the surface position detector 103.

An improvement in optical design, such as the widening of an angle at which detection light of the surface position detector 103 is incident on the surface of the substrate W, or the decrease in the NA of the detection light, may be a countermeasure. However, this countermeasure causes a decrease in the size of the surface position detector 103 and a shortage of the amount of light, to result in a significant deterioration in detection accuracy.

To solve this problem, it may be a countermeasure to arrange the surface position detector 103 at a position where a necessary accuracy can be maintained, that is, a position spaced apart from the projection optical system UL, to set a position different from the exposure area on the substrate W as the measurement area of the surface position detector 103. However, even when this method is used to generate a correction table for the positional shift of the substrate stage, the position of the moving mirror 102 referred to by the laser interferometer in generating the correction table becomes different from that in controlling the substrate stage during exposure. Furthermore, the position of the substrate stage WS on its surface plate changes between the correction table generation time and the exposure time. This makes it impossible to accurately position the substrate W at the focal plane FP of the projection optical system UL, even by correcting and driving the substrate stage WS based on the correction table obtained, while the measurement area of the surface position detector 103 does not exist in the exposure area.

SUMMARY OF THE INVENTION

The present invention has been made in consideration of the above problems, and has as its object, for example, to provide an exposure apparatus having a surface position measurement means suitable for a high-NA exposure apparatus, or a liquid immersion exposure apparatus.

According to the present invention, an exposure apparatus comprises an original stage, an illumination optical system which illuminates an original held by the original stage, a substrate stage, and a projection optical system which projects a pattern of the original onto a substrate on the substrate stage. The apparatus comprises an image sensor, a measurement optical system configured to guide measurement light to obliquely enter the projection optical system, and to further guide the measurement light returned from the projection optical system to the image sensor, and a control unit configured to calculate surface position information of the substrate based on the output from the image sensor. The image sensor senses (i) an image of a mark formed by measurement light which emerges from the measurement optical system, is obliquely incident on the mark arranged on the original stage, passes through the mark and the projection optical system, is incident on the substrate on the substrate stage, is reflected by the substrate, passes through the projection optical system, and returns to the measurement optical system again, and (ii) an image of the mark formed by measurement light which emerges from the measurement optical system, is obliquely incident on the mark arranged on the original stage, is reflected by the mark, and returns to the measurement optical system again. The control unit calculates the surface position information of the substrate based on an interval between the image of the mark formed by the measurement light, which has passed through the mark, and the image of the mark formed by the measurement light reflected by the mark.

According to the present invention, for example, an exposure apparatus having a surface position measurement means suitable for a high-NA exposure apparatus or a liquid immersion exposure apparatus is provided.

Further features of the present invention will become apparent from the following description of exemplary embodiments, with reference to the attached drawings.

DESCRIPTION OF THE EMBODIMENTS

Preferred embodiments of the present invention will be described below with reference to the accompanying drawings.

First Embodiment

Figure 3:
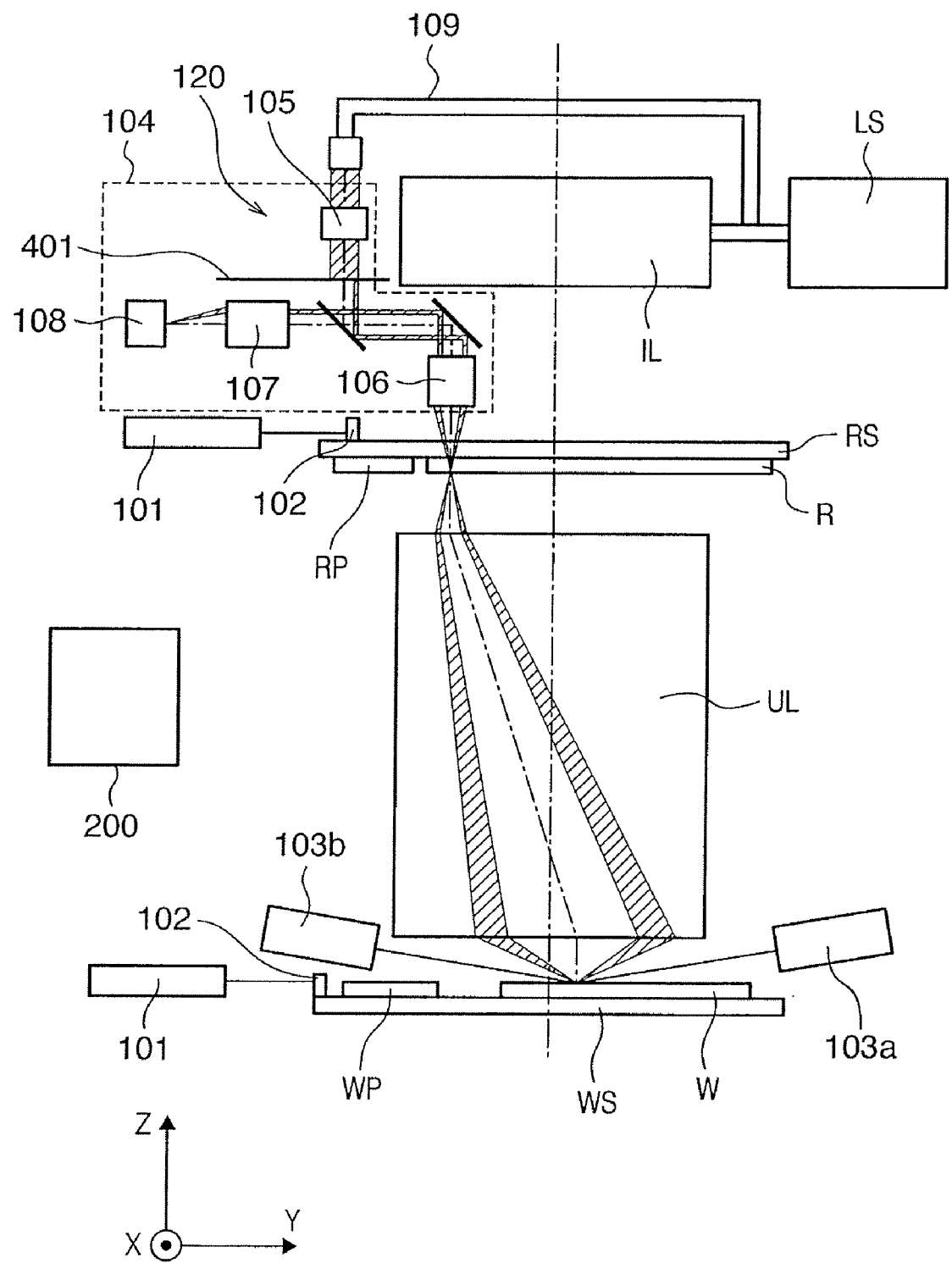
FIG. 3 is a view showing a schematic arrangement of an exposure apparatus according to the first embodiment of the present invention.

FIG. 3 is a view showing a schematic arrangement of an exposure apparatus according to the first embodiment of the present invention. The exposure apparatus shown in FIG. 3 is applicable to both an exposure apparatus which exposes a substrate (wafer) W without filling the space between a projection optical system UL and the substrate W with a liquid, and an exposure apparatus which exposes the substrate W by filling the space between the projection optical system UL and the substrate W with a liquid. In the first embodiment, a scanning exposure apparatus will be explained as an application example. The scanning exposure apparatus transfers the circuit pattern of a semiconductor device onto the substrate W by the step and repeat scheme, using an original (reticle) R on which the circuit pattern is formed.

The exposure apparatus comprises an original stage RS, an illumination optical system IL for illuminating the original R held by the original stage RS, a substrate stage WS, and the projection optical system UL for projecting the pattern of the original R onto the substrate W on the substrate stage WS.

Figure 1:
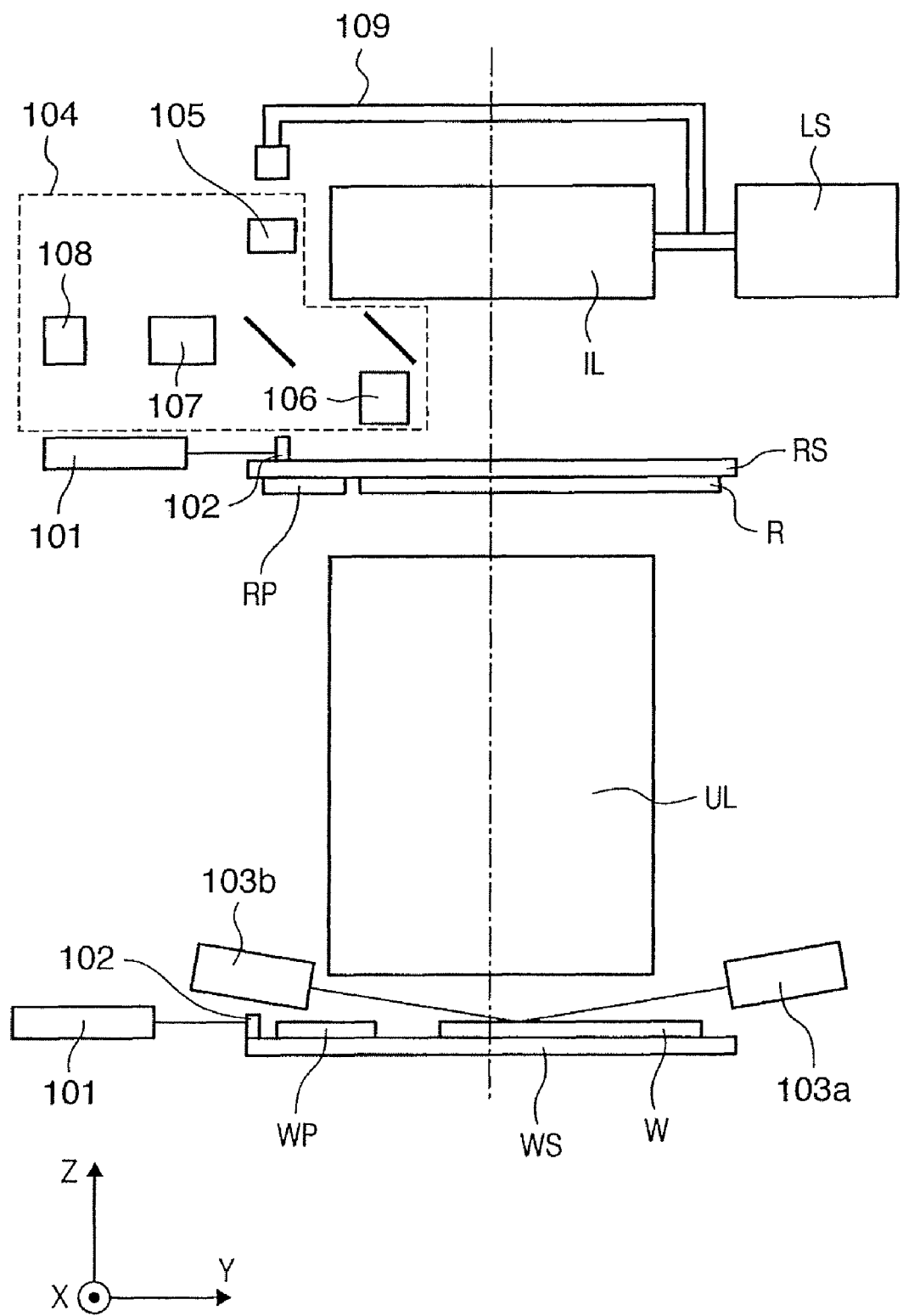
FIG. 1 is a view showing a schematic arrangement of an exposure apparatus.
Figure 2:
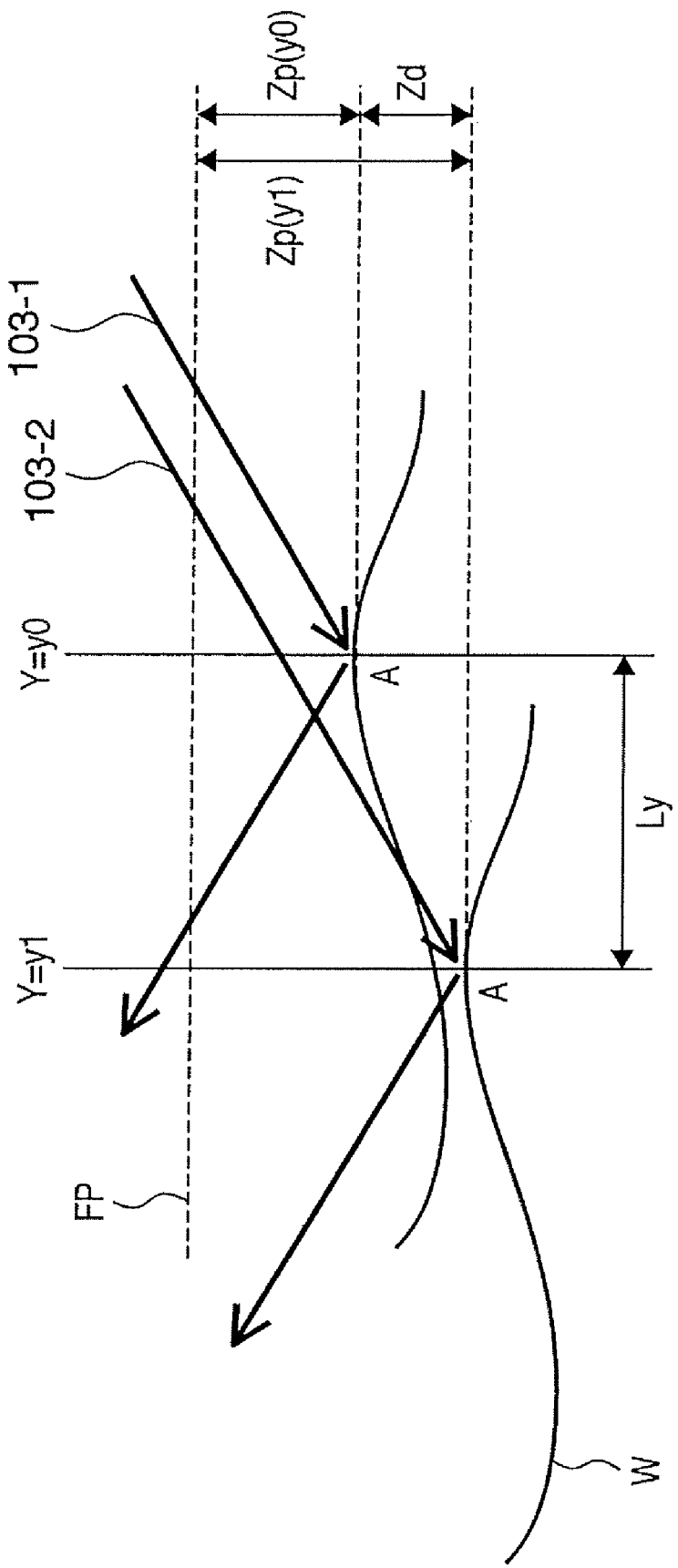
FIG. 2 is a view showing the state in which a surface position detector measures the positional shift of a substrate stage.

The following description is based on an X-Y-Z orthogonal coordinate system shown in FIG. 3. The X-Y-Z orthogonal coordinate system is determined such that a plane defined by the X and Y directions becomes parallel to the surface of the substrate W and the Z direction becomes perpendicular to the surface of the substrate W. The same reference numerals as those in FIG. 1 denote the same constituent elements in FIG. 3, and a description thereof will be omitted or simplified.

The exposure apparatus shown in FIG. 3 comprises a light source LS. A preferable example of the light source LS is an ArF excimer laser, which emits light having a wavelength of 193 nm. However, the light source LS may adopt, for example, a mercury lamp, a KrF excimer laser (248 nm), or an EUV light source. A light beam emitted by the exposure light source LS enters the illumination optical system IL. After being changed into a set shape, coherency, and polarization state, the light beam illuminates the original R. The projection optical system UL images, on the substrate W arranged on the substrate stage WS, the light diffracted by the fine circuit pattern formed on the lower surface of the original R.

Substrate surface position detection by a TTR detector 104 will be explained. As shown in FIG. 3, the exposure apparatus according to the first embodiment includes only one TTR detector 104. The substrate may be a substrate, such as an exposure target wafer, or a measurement substrate.

Figure 4:
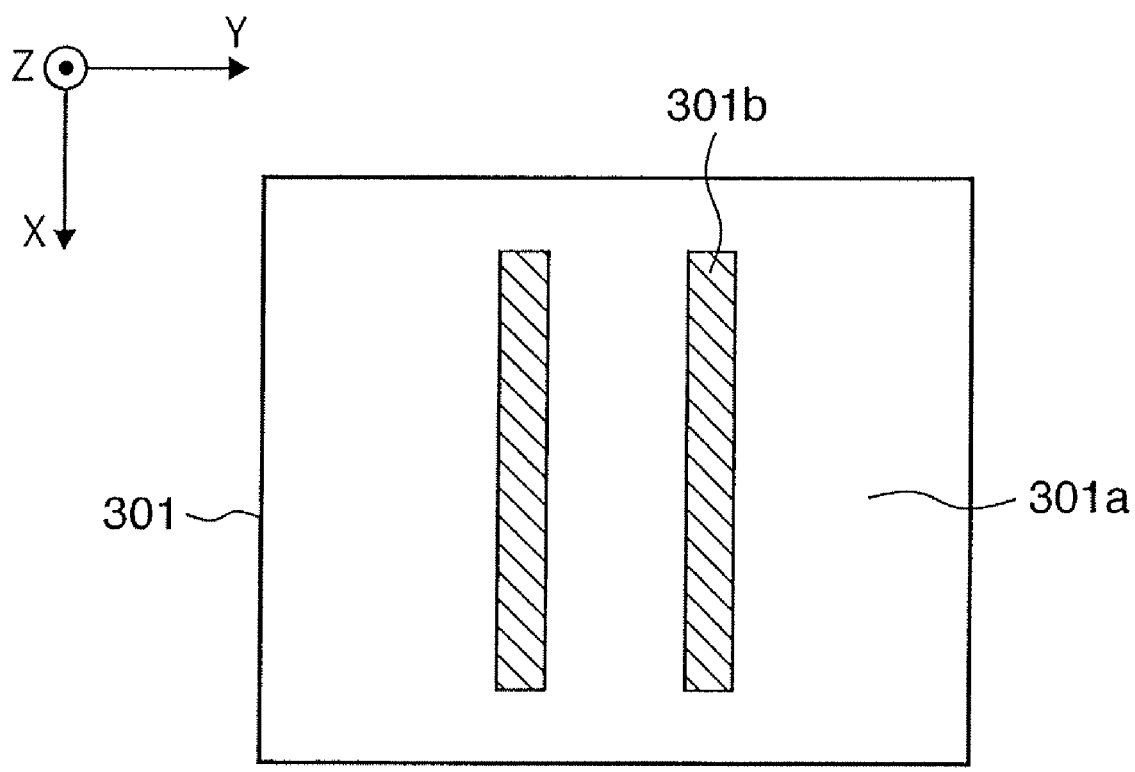
FIG. 4 is a view illustrating a surface position measurement mark used in surface position measurement by a TTR detector.

To detect the surface position of the substrate W, the TTR detector 104 uses a surface position measurement mark 301, as illustrated in FIG. 4. The surface position measurement mark 301 is formed on an original reference plate RP, and includes a transmissive part 301a and a reflective part 301b. The transmissive part 301a transmits measurement light. The reflective part 301b is made of a metal film of, for example, Cr, and reflects the measurement light. In the example shown in FIG. 4, the surface position measurement mark 301 includes a plurality of linear reflective parts 301b having a long side in the X direction. In addition to the surface position measurement mark 301, an original reference mark RM, or the like, can be formed on the original reference plate RP. The original reference mark RM may also have a surface position measurement function. The surface position measurement mark 301 is not particularly limited to the form shown in FIG. 4, and may include, for example, a linear transmissive part.

The TTR detector 104 includes a measurement optical system 120 and an image sensor 108 serving as a photo-receiving unit. The measurement optical system 120 guides measurement light to obliquely enter the projection optical system UL and receives the measurement light returned from the projection optical system UL again. The measurement light obliquely enters the projection optical system UL and passes through it. The measurement light then is incident on the substrate W on the substrate stage WS, is reflected by the substrate W, and passes through the projection optical system UL again. The image sensor 108 receives this measurement light on its image sensing plane.

The measurement optical system can include, for example, an illumination unit 105, an objective lens 106, a relay lens 107, and a light guide system 109. The light guide system 109 includes, for example, an optical fiber, a lens, and a mirror. The light guide system 109 partially guides light emitted by the light source LS to the illumination unit 105 of the TTR detector 104.

Figure 5:
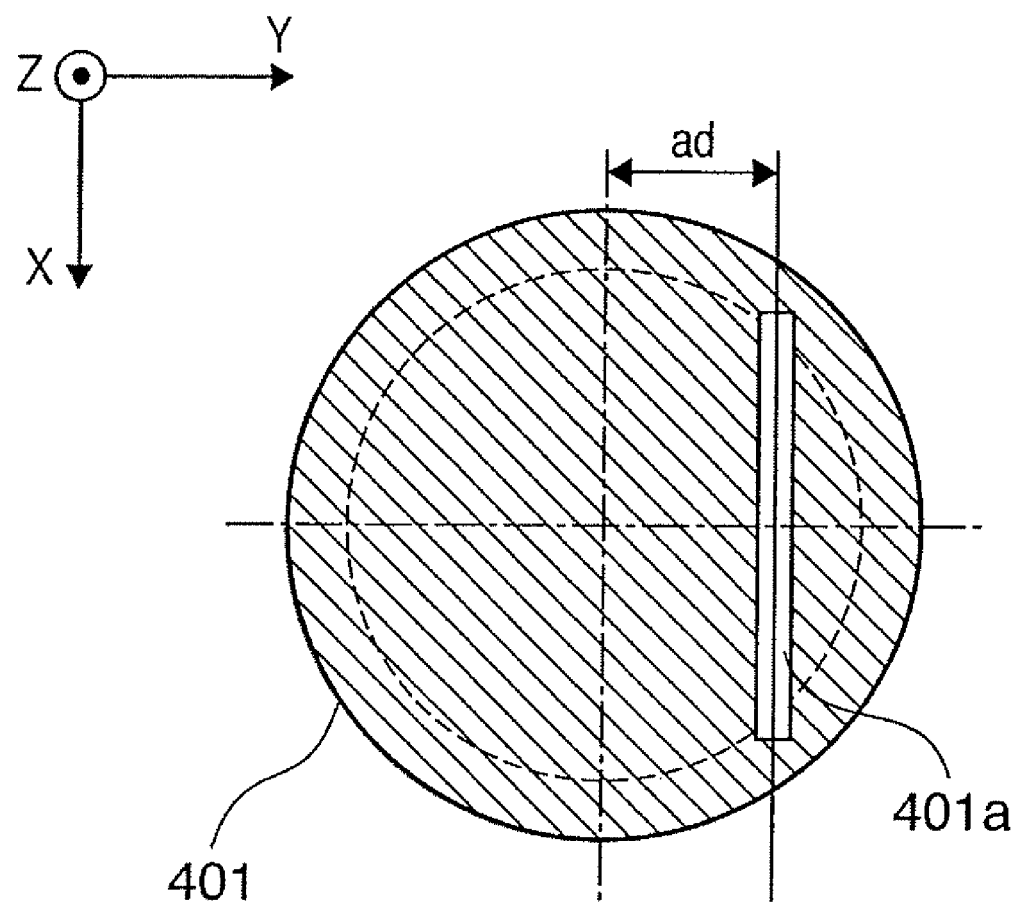
FIG. 5 is a view illustrating a grazing-incidence aperture stop used in surface position measurement by the TTR detector.

A grazing-incidence aperture stop 401 confines light emitted by the illumination unit 105, to regulate measurement light to be obliquely applied to the projection optical system UL. The grazing-incidence aperture stop 401 is preferably arranged at a position that is almost conjugate to the aperture stop plane, that is, a so-called pupil plane of the projection optical system UL. FIG. 5 is a view schematically showing an arrangement of the grazing-incidence aperture stop 401. As illustrated in FIG. 5, the grazing-incidence aperture stop 401 has no opening on the optical axis of the TTR detector 104, but has a slit-like opening 401a at a position shifted from the optical axis in the Y direction. For this reason, the measurement light, which has passed through the objective lens 106, is obliquely incident on the surface position measurement mark 301 at an incident angle corresponding to a position ad of the opening 401a. The shape of the opening 401a is not particularly limited to a slit and may be a circle or rectangle, as long as it is arranged at a position shifted from the optical axis in the Y direction. A dotted line in FIG. 5 indicates a light beam effective diameter at the aperture stop position.

In the TTR detector 104, for example, a circular aperture stop, and the like, for measuring the positions of the original reference mark RM, and a substrate reference mark WM in the X and Y directions can be arranged at the same position as the grazing-incidence aperture stop 401, although not shown in FIG. 3. The switching between the circular aperture stop and the grazing-incidence aperture stop 401 makes it possible to switch the position measurement function in the X-Y plane for the substrate reference mark WM and the surface position measurement function for the substrate W. An actuator can switch between the grazing-incidence aperture stop 401 and the circular aperture stop. The grazing-incidence aperture stop 401 and circular aperture stop may be formed on the same plate or on separate plates.

For example, a control unit 200 moves the relay lens 107, or the like, of the TTR detector 104 before the surface position detection of the substrate W to focus the pattern plane of the original reference plate RP on the image sensing plane of the image sensor 108 in the TTR detector 104. This operation, hereafter, will be called original focus calibration. The original focus calibration may use the circular aperture stop or grazing-incidence aperture stop 401. In addition, the original focus calibration may use the original reference mark RM or surface position measurement mark 301.

After original focus calibration, the control unit 200 moves the grazing-incidence aperture stop 401 to the optical path of the measurement light. Then, the original stage RS and TTR detector 104 move to be able to observe the surface position measurement mark 301 via the TTR detector 104.

Figure 6:
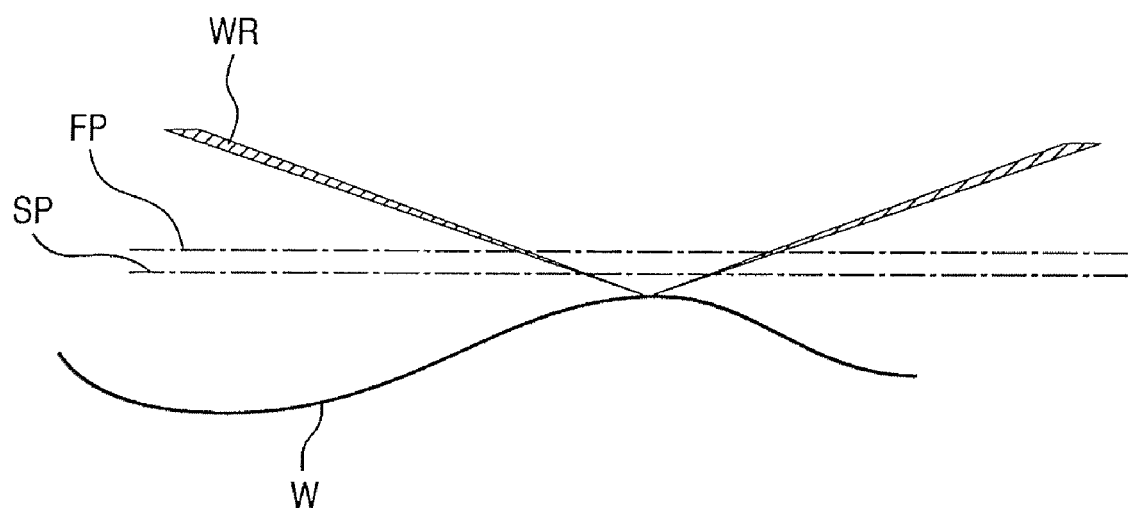
FIG. 6 is a view illustrating an optical path in surface position measurement by the TTR detector.

As illustrated in FIG. 6, the control unit 200 drives the substrate stage WS in the Z direction to deviate the substrate W from a focal plane FP of the projection optical system UL. The driving direction of the substrate stage WS may be a +Z or −Z direction. The amount of driving the substrate stage WS is several μm to several tens of μm. The reference surface position of the driven substrate stage WS becomes a measurement origin SP of surface position detection.

Assume that the reference surface of the substrate stage WS exists on the focal plane FP of the projection optical system UL. The measurement light transmitted through the line pattern of the surface position measurement mark 301 is incident on the substrate W via the projection optical system UL and is reflected by the substrate W. The measurement light then forms an image on the line pattern of the surface position measurement mark 301 via the projection optical system UL again. The reference surface of the substrate stage WS indicates the surface of the substrate W on the substrate stage WS.

Figure 7:
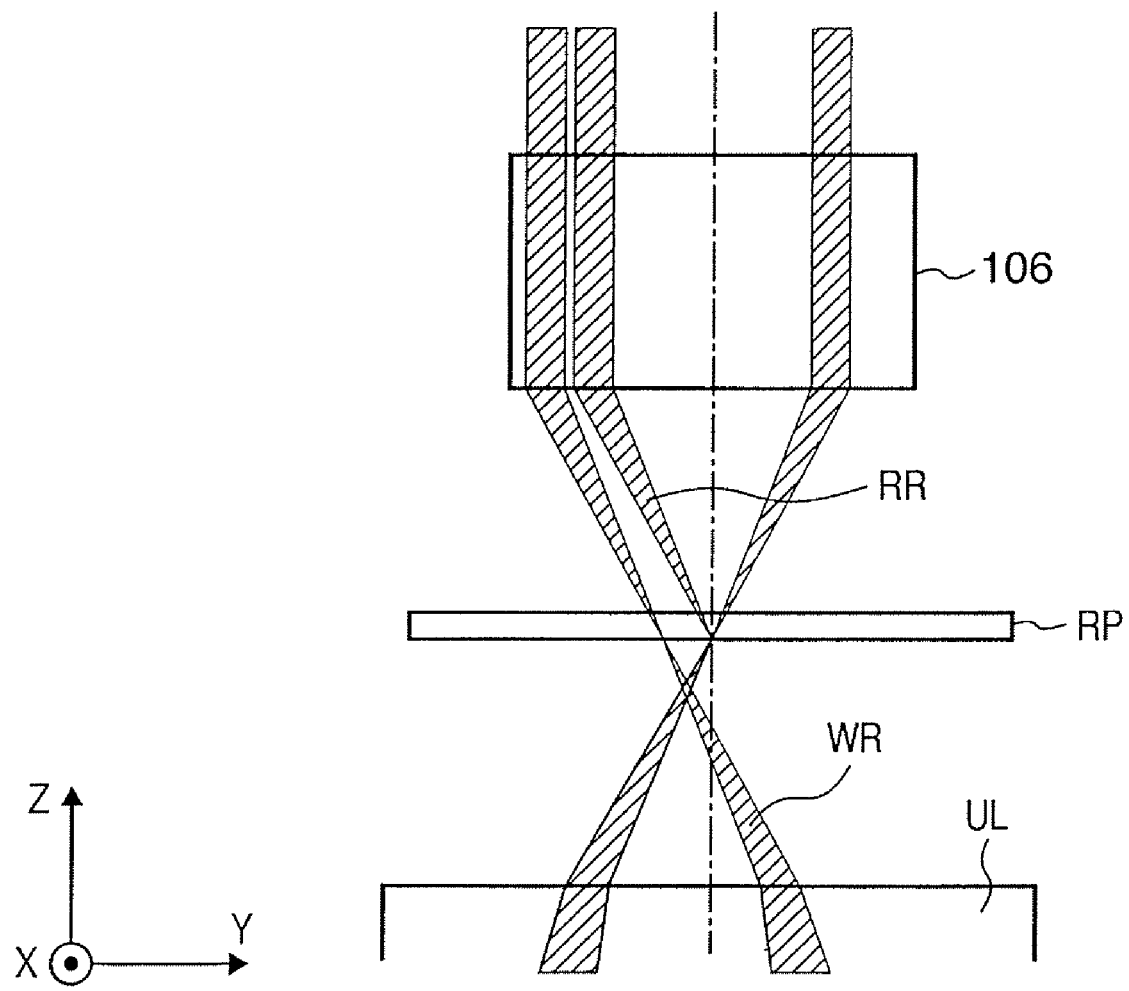
FIG. 7 is a view illustrating another optical path in surface position measurement by the TTR detector.

However, the above description does not apply to the case in which the reference surface of the substrate stage WS is at a position deviated from the focal plane FP of the projection optical system UL in the Z direction by driving the substrate stage WS via the control unit 200, and the surface position measurement mark 301 is obliquely illuminated using the grazing-incidence aperture stop 401. In this case, as illustrated in FIG. 7, the measurement light (to be referred to as substrate-reflected light WR hereinafter) reflected by the substrate W does not return on the line pattern of the surface position measurement mark 301, but forms an image at a position shifted in the Y direction in accordance with the driving amount in the Z direction and the opening position ad. The substrate-reflected light WR then passes near the line pattern. FIG. 7 shows the case in which the substrate stage WS is driven in the −Z direction.

Figure 8:
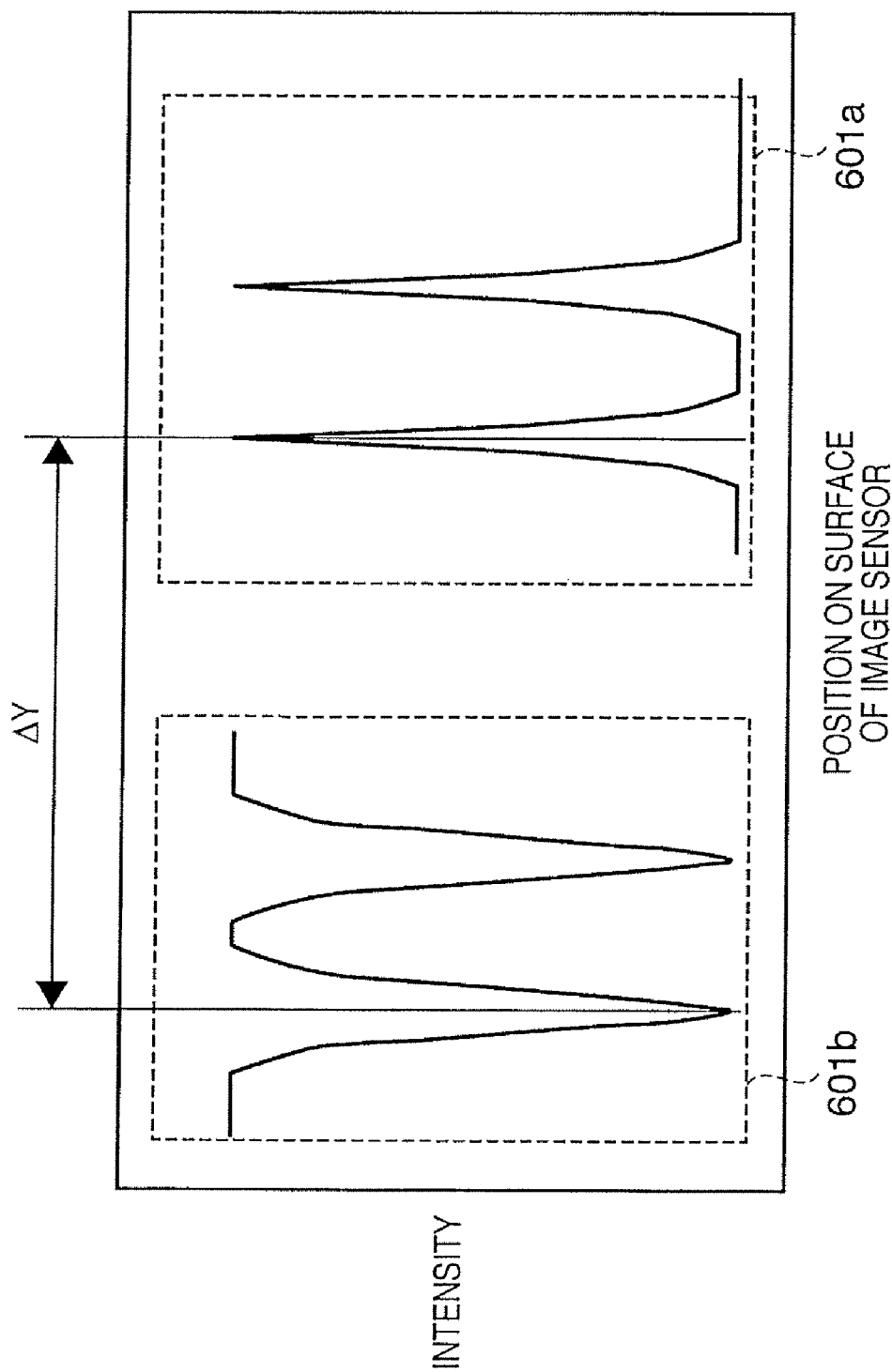
FIG. 8 is a graph illustrating an intensity profile on the surface of an image sensor upon surface position measurement by the TTR detector.

After completing the driving, the control unit 200 causes the TTR detector 104 to illuminate the surface position measurement mark 301, and causes the image sensor 108 to sense the substrate-reflected light WR and the light (to be referred to as original-reflected light RR hereinafter) reflected by the surface position measurement mark 301. The original-reflected light RR and substrate-reflected light WR form a line pattern (an image of the mark 301) on the image sensing plane of the image sensor 108. FIG. 8 illustrates the obtained intensity profile in the Y direction. Referring to FIG. 8, reference numeral 601a denotes the intensity profile of the original-reflected light RR; and reference numeral 601b denotes the intensity profile of the substrate-reflected light WR. ΔY is a value which depends on the opening position ad of the grazing-incidence aperture stop 401 and the amount of driving of the substrate stage WS in the −Z direction. If the difference in the amount of light between the original-reflected light RR and the substrate-reflected light WR is large, the contrast of the line pattern image changes. This may result in a decrease in measurement accuracy. To prevent this problem, it is preferable to adjust the reflectance of the metallic portion of the surface position measurement mark 301 so that the amounts of light of the two reflected light beams become almost equal.

The control unit 200 scan-moves the substrate stage WS in the Y direction while the TTR detector 104 illuminates the surface position measurement mark 301. The image sensor 108 senses the original-reflected light RR and substrate-reflected light WR for every predetermined interval. Alternatively, the control unit 200 may drive the substrate stage WS step by step in the Y direction, to cause the image sensor 108 to sense the original-reflected light RR and substrate-reflected light WR for every step.

Figure 9:
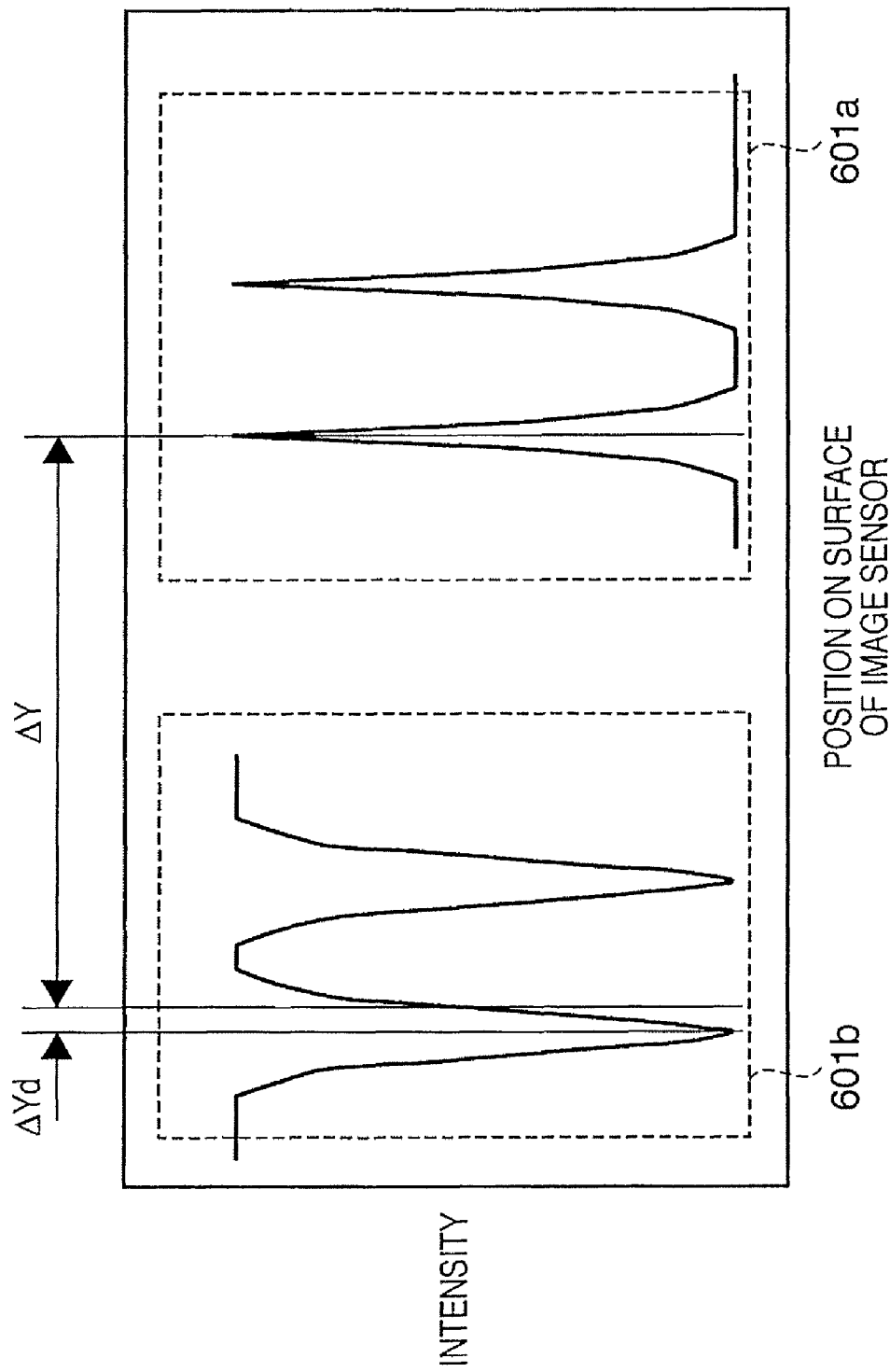
FIG. 9 is a graph illustrating another intensity profile on the surface of the image sensor upon surface position measurement by the TTR detector.

The surface of the substrate W is not completely flat, but is uneven. When the substrate stage WS is driven in the Y direction, the surface position of the substrate W at the measurement point of the TTR detector 104 slightly changes in the Z direction by ΔZ, depending on the unevenness. As the surface position measurement mark 301 is obliquely illuminated, the image sensor 108 detects, on its image sensing plane, a change in the surface position of the substrate W in the Z direction, as a very small shift ΔYd of the substrate-reflected light WR, as illustrated in FIG. 9. Since the original stage RS does not move at this time, a shift of the original-reflected light RR does not occur on the image sensing plane of the image sensor 108. It is, therefore, possible to measure the shift ΔYd with reference to the original-reflected light RR based on the output from the image sensor 108. The control unit 200 calculates, as the surface position information of the substrate W, a very small change ΔZ in the surface position of the substrate W from the measurement origin SP of the TTR detector 104 based on the shift ΔYd.

Executing such measurement over the entire surface of the substrate W makes it possible to measure the surface shape of the substrate W.

In the first embodiment, the grazing-incidence aperture stop 401 has the opening 401a at a position shifted from the optical axis in the Y direction. Instead, a slit-like opening may be formed at a position shifted from the optical axis in the X direction.

Moving the TTR detector 104 in the exposure slit allows surface position measurement at each image height of the projection optical system UL.

Second Embodiment

The second embodiment applies the surface position measurement by the TTR detector 104, described in the first embodiment, to generate a correction table to correct the positional shift of the substrate stage WS in the Z direction. Details that are not particularly referred to in this embodiment are described in the first embodiment.

To measure the positional shift of a substrate stage WS in the Z direction using a TTR detector 104, an exposure target substrate or a measurement substrate may be arranged on the substrate stage WS. A preferable example of the measurement substrate is a reflecting substrate made of a metal having high reflectance to measurement light and/or high flatness.

Figure 10:
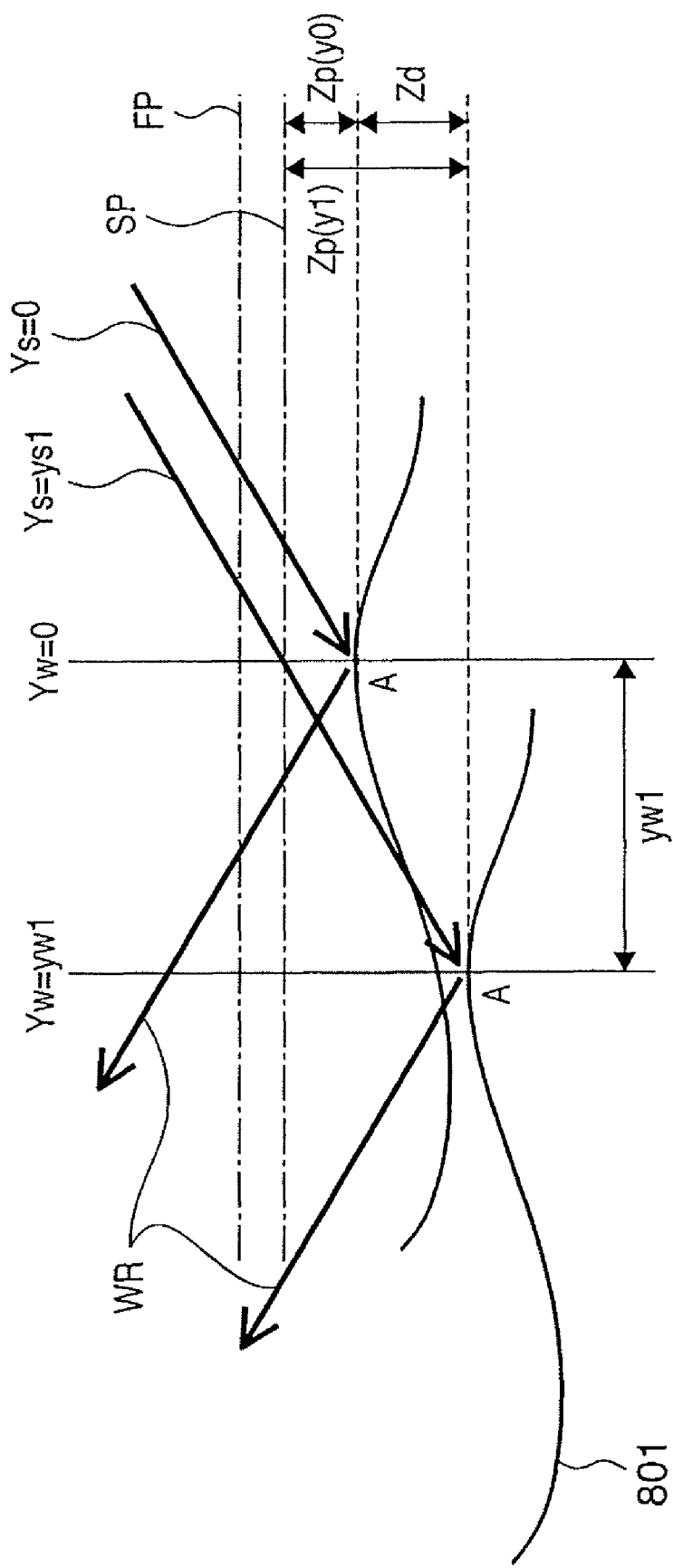
FIG. 10 is a view showing the state in which a TTR detector measures the positional shift of a substrate stage.

As shown in FIG. 10, when the TTR detector 104 exists at a given image height (first position: Ys=0) of a projection optical system UL, and the substrate stage WS exists at a position Yw=0, the surface position of a substrate W at a point A is measured in accordance with the method described in the first embodiment. This measurement value is defined as Zp(y0).

The TTR detector 104 then moves to an image height (second position: Ys=ys1) that is different from the first position Ys=0 of the projection optical system UL, and the substrate stage WS moves to a position Yw=yw1. The amounts of driving of the TTR detector 104 and substrate stage WS are based on a magnification M of the projection optical system UL to satisfy yw1=M×ys1.

The measurement position of the driven TTR detector 104 also lies at the point A on the substrate W. Letting Zp(y1) be the measurement value of the driven TTR detector 104, the measurement values Zp(y1) and Zp(y0) must be equal, irrespective of the unevenness of the surface of the substrate W. Assume, however, that after driving the substrate stage WS from the position Yw=0 to the position Yw=yw1, the surface position of the substrate W in the Z direction has shifted by Zd upon the positional shift of the substrate stage WS in the Z direction. In this case, the positional shift Zd can be calculated by:

$$Zp(y1)=Zp(y0)+Zd$$

where Zp(y0) and Zp(y1) are measurement values obtained by the TTR detector 104. It is possible to lay out one surface position measurement mark 301 at each of the positions Ys=0 and Ys=ys1 in the exposure slit on an original reference plate RP. Alternatively, only one surface position measurement mark 301 may be arranged on the original reference plate RP and an original stage RS may be moved so that the TTR detector 104 can observe the surface position measurement mark 301 at each of the positions Ys=0 and Ys=ys1 of the TTR detector 104.

A control unit 200 executes the above-described measurement over the entire surface of the substrate W. The control unit 200 measures the positional shift of the substrate stage WS in the Z direction upon driving it in the Y direction over its entire movable range. Based on the measurement result, the control unit 200 generates a correction table to correct the positional shift in the Z direction. The correction table contains information for driving the substrate stage WS in the Z direction in accordance with the X-Y position to cancel the positional shift of the substrate stage WS in the Z direction.

It is also possible to generate, using a similar method, a correction table to correct the positional shift of the substrate stage WS in the Z direction upon driving it in the X direction, instead of the above-mentioned Y direction. More specifically, assume that the TTR detector 104 exists at a given image height (Xs=0) of the projection optical system UL, and Zp (x0) is the surface position of the substrate W measured, while the substrate stage WS exists at the image height Xw=0. Assume also that the TTR detector 104 exists at an image height (Xs=xs1), which is different from the image height Xs=0 of the projection optical system UL, and Zp(x1) is the surface position of the substrate W measured, while the substrate stage WS exists at the image height Xw=xw1. The control unit 200 can calculate the positional shift of the substrate stage WS in the Z direction based on the two measurement results Zp(x0) and Zp(x1). Similar to the Y direction, xw1=M×xs1.

The measurement method when the substrate stage WS moves from the position Yw=0 to the position Yw=yw1 (yw1>0), that is, when the substrate stage WS is driven in the +Y direction has been exemplified above. When the substrate stage WS moves in the opposite direction, the sign of the calculated value Zd may be inverted or the above surface positions may be newly measured while the substrate stage WS exists at the positions Yw=0 and Yw=−yw1. When the substrate stage WS is driven in the −Y direction to generate a correction table in this manner, it is possible to cope with even the case in which the amount of positional shift in the Z direction changes depending on the scanning direction.

In the preferred embodiment of the present invention, the surface position of the substrate W is measured with reference to the position of an original-reflected light RR on the surface of an image sensor 108. Assume that the TTR detector 104 and surface position measurement mark 301 move in the horizontal direction to generate a correction table. If the TTR detector 104 and surface position measurement mark 301 have shifted in the optical axis direction, the position of the original-reflected light RR on the surface of the image sensor 108 changes. This makes it impossible to accurately measure the surface position of the substrate W. To prevent this problem, after driving the TTR detector 104 and surface position measurement mark 301, focus calibration on the side of the original R may be performed again to accurately focus the surface position measurement mark 301 on the image sensor 108. Alternatively, the positional shift of the substrate stage WS in the Z direction generated as the TTR detector 104 and surface position measurement mark 301 move in the horizontal direction may be separately measured to correct it in surface position measurement.

Third Embodiment

In the third embodiment, a correction table to correct the positional shift of a substrate stage WS is generated using a surface position detector 103 and TTR detector 104. Details that are not particularly referred to are described in the first and second embodiments.

The surface position detector 103 obliquely applies measurement light to a substrate W without a projection optical system UL, and receives the light reflected by the substrate W to detect the surface position information of the substrate W. The surface position detector 103 typically uses a measurement area that is different from an exposure area.

While the substrate (preferably, measurement reflecting substrate) W held by the substrate stage WS falls within the measurement range of the surface position detector 103, a control unit 200 drives the substrate stage WS in the horizontal direction. The surface position detector 103 measures the surface position of the substrate W. The control unit 200 measures the positional shift of the substrate stage WS from this measurement result in accordance with the above-described method. The control unit 200 subtracts the positional shift of the substrate stage WS from the surface position measurement value of the substrate W to calculate the surface shape of the substrate W.

The control unit 200 drives the substrate stage WS to the exposure position. While the TTR detector 104 is arranged at a given image height of the projection optical system UL, the surface position detector 103 measures the surface position of the substrate W, based on the procedure described in the first embodiment. This surface position measurement result contains the surface shape of the substrate W and the positional shift of the surface of the substrate W due to the positional shift of the substrate stage WS. Subtracting the calculated value indicating the surface shape of the substrate W from the surface position measurement result obtained by the TTR detector 104 makes it possible to calculate the positional shift of the substrate stage WS.

In the third embodiment, when the surface position detector 103 measures the surface shape of the substrate W in advance, it is unnecessary to drive the TTR detector 104 in the horizontal direction in measuring the positional shift of the substrate stage WS. For this reason, the load center of gravity of the TTR detector 104 in the exposure apparatus never changes. This prevents any decrease in surface position measurement accuracy due to a driving error of the TTR detector 104 in the horizontal and Z directions.

The third embodiment is also advantageous for use with, for example, a twin-stage exposure apparatus. The twin-stage exposure apparatus comprises a measurement station and an exposure station. The measurement station has two substrate stages WS for holding a substrate W, and is used to measure the surface shape of the substrate W and the position of the substrate W on the substrate stage WS. The exposure station has a projection optical system UL and is used to expose the substrate W.

The surface position detector 103 is arranged on the measurement station. The surface position detector 103 measures the surface position of the substrate W by driving the substrate stage WS in the same manner as in exposure. The control unit 200 measures the positional shift of the substrate stage WS on the measurement station from this measurement result, in accordance with the above-described method. The control unit 200 then subtracts the positional shift of the substrate stage WS from the surface position measurement value of the substrate W to calculate the surface shape of the substrate W.

After completing the above-described processing, the control unit 200 moves the substrate stage WS to the exposure station. While the TTR detector 104 is arranged at a given image height of the projection optical system UL, the surface position detector 103 measures the surface position of the substrate W based on the procedure described in the first embodiment. This surface position measurement result contains the surface shape of the substrate W and the positional shift of the surface of the substrate W due to the positional shift of the substrate stage WS on the exposure station.

Subtracting the surface shape value of the substrate W, which is calculated on the measurement station, from the surface position measurement result obtained by the TTR detector 104, makes it possible to calculate the positional shift of the substrate stage WS on the exposure station. If the TTR detector 104 and surface position detector 103 detect different surface position measurement values, they measure those of a substrate W having a known shape. It suffices to execute calibration based on these measurement values, so that the surface position measurement values of the detectors 104 and 103 coincide with each other.

Also, in the twin-stage exposure apparatus, when the surface position detector 103 measures the surface shape of the substrate W in advance, it is unnecessary to drive the TTR detector 104 in the horizontal direction in measuring the positional shift of the substrate stage WS. For this reason, the load center of gravity of the TTR detector 104 in the exposure apparatus never changes. This prevents any decrease in surface position measurement accuracy due to a driving error of the TTR detector 104 in the horizontal and Z directions.

Fourth Embodiment

The fourth embodiment provides a technique of generating a correction table to correct the positional shift of a substrate stage WS using at least two TTR detectors 104 provided in an exposure apparatus.

Figure 11:
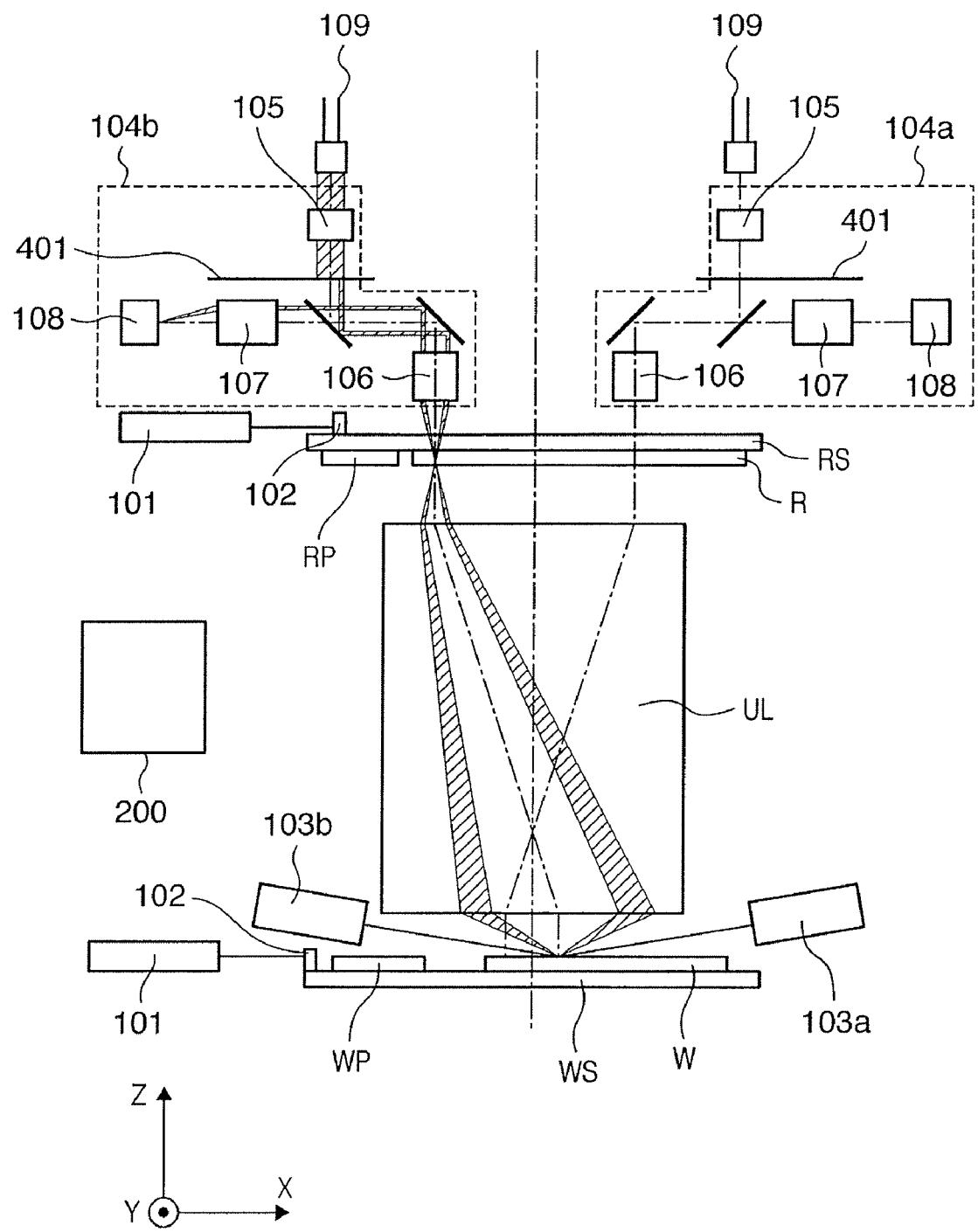
FIG. 11 is a view showing a schematic arrangement of an exposure apparatus according to the fourth embodiment of the present invention.
Figure 12:
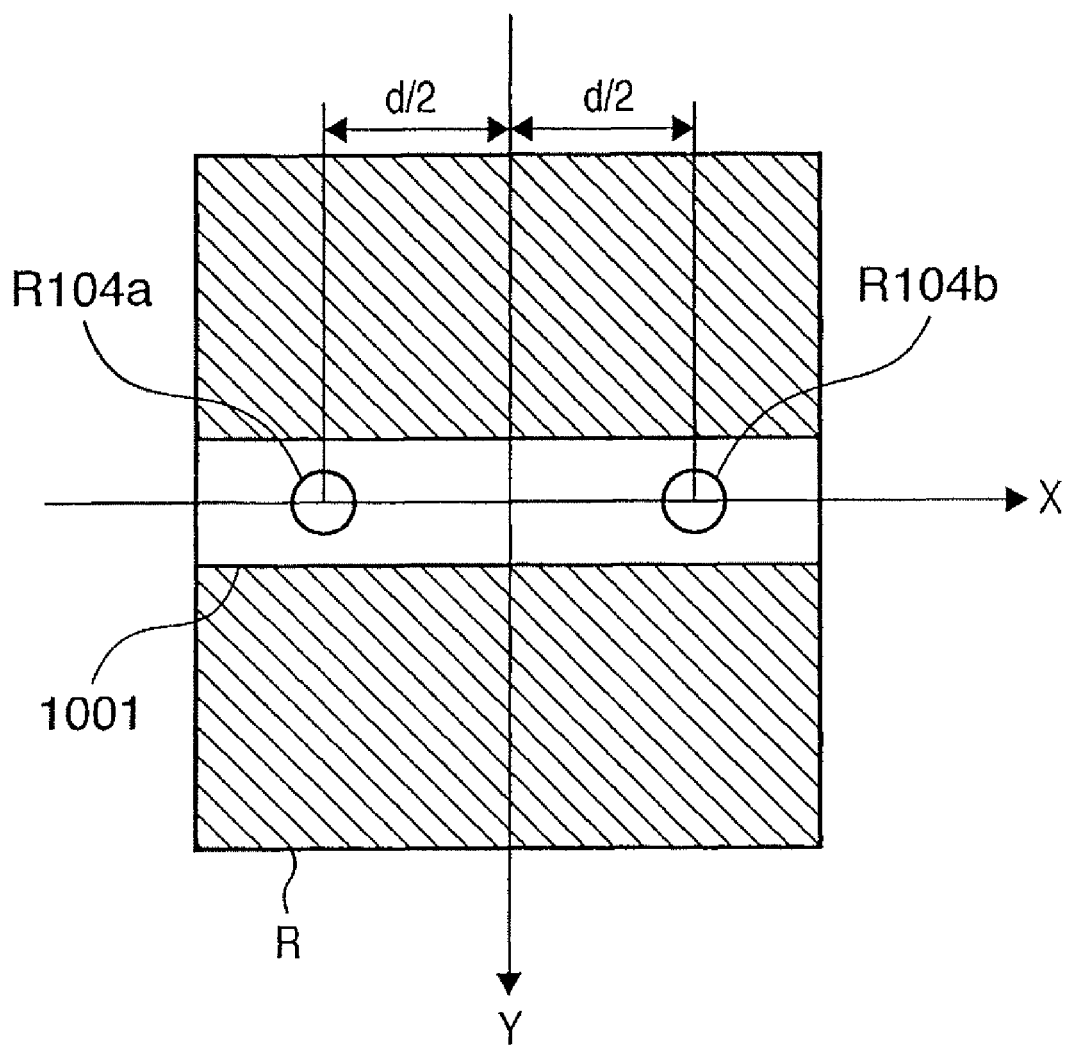
FIG. 12 is a view illustrating an arrangement of a TTR detector.

FIG. 11 is a view showing a schematic arrangement of an exposure apparatus according to the fourth embodiment of the present invention. The same reference numerals as those in FIG. 1 denote the same constituent elements in FIG. 11, and a description thereof will be omitted or simplified. FIG. 12 is a view schematically showing a layout of measurement areas R104a and R104b of two TTR detectors 104a and 104b.

For example, the measurement areas R104a and R104b of the TTR detectors 104a and 104b are arranged symmetrically with respect to the Y-axis in an exposure slit 1001 for scanning exposure.

In the exposure apparatus according to the fourth embodiment, the two TTR detectors 104a and 104b can detect an original reference mark RM and a substrate reference mark WM at different image heights of a projection optical system UL, and also, detect the surface position of a substrate.

As illustrated in FIG. 12, the measurement area R104a of the TTR detector 104a is laid out at a position X=−d/2 (first position), while the measurement area R104b of the TTR detector 104b is laid out at a position X=d/2 (second position) (d>0), where d is the interval between the measurement areas of the two TTR detectors 104a and 104b. After the TTR detector 104b measures the surface position at a point A on a substrate W, the substrate stage WS is driven in the +X direction by an amount (i.e., d×M) obtained by multiplying the interval d by a magnification M of the projection optical system UL. After driving the substrate stage WS, the TTR detector 104a can measure the surface position at the point A, which is measured by the TTR detector 104b before driving the substrate stage WS. That is, similar to the measurement method described in the first embodiment, it is possible to generate a correction table to correct the positional shift of the substrate stage WS in the X direction without driving the TTR detectors 104a and 104b in the X direction. To generate a correction table to correct the positional shift of the substrate stage WS in the Y direction, it suffices to arrange the two TTR detectors 104a and 104b, side by side, in the Y direction.

As has been described above, according to the fourth embodiment, it is unnecessary to drive the TTR detector 104 in the horizontal direction. This makes it possible to shorten the time taken to generate a correction table to correct the positional shift of the substrate stage WS. In addition, the load center of gravity of the TTR detector 104 in the exposure apparatus never changes. This prevents any decrease in surface position measurement accuracy due to a driving error of the TTR detector 104 in the horizontal and Z directions.

Fifth Embodiment

Figure 13:
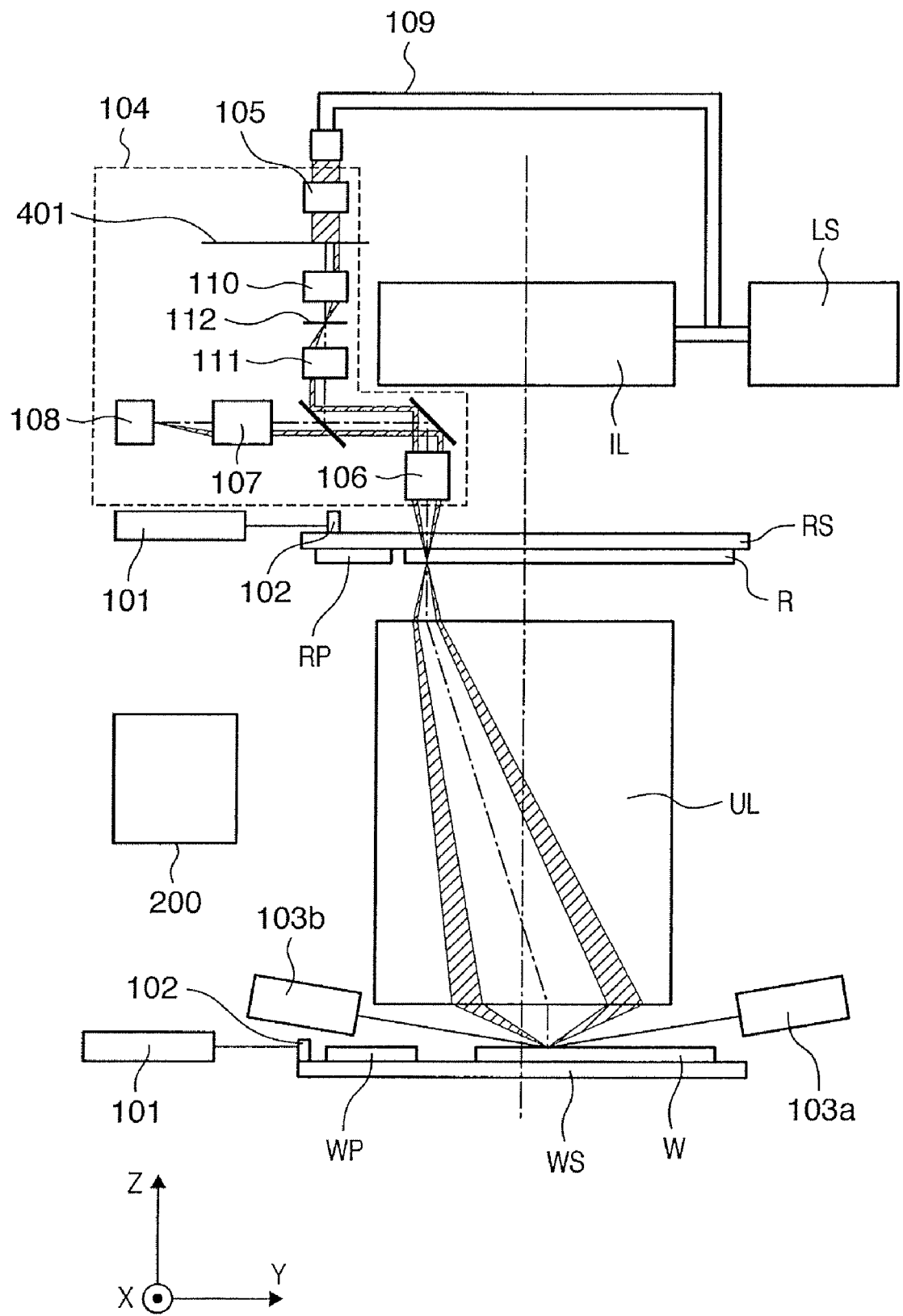
FIG. 13 is a view showing a schematic arrangement of an exposure apparatus according to the fifth embodiment of the present invention.

The fifth embodiment provides an arrangement in which a surface position measurement mark 301 as illustrated in FIG. 4 is formed on an illumination field stop 112, which is conjugate to an original reference mark RM in an illumination unit of a TTR detector 104. The illumination field stop 112 can be interposed between relay lenses 110 and 111. FIG. 13 is a view showing a schematic arrangement of an exposure apparatus according to the fifth embodiment of the present invention. The surface position measurement mark 301 can be formed by a plurality of line patterns having transmittance or absorbance to measurement light. Arranging the surface position measurement mark 301 on the illumination field stop 112 obviates the need for forming it on an original reference plate RP.

Also, with the layout of the surface position measurement mark 301 according to the fifth embodiment, it is possible to measure the surface position of a substrate W and to generate a correction table to correct the positional shift of a substrate stage WS. According to the fifth embodiment, an original stage RS moves in the horizontal direction while the substrate stage WS is fixed. This makes it possible to measure the surface position of the original reference plate RP and to generate a correction table to correct the positional shift of the original stage RS.

Application Example

Figure 14:
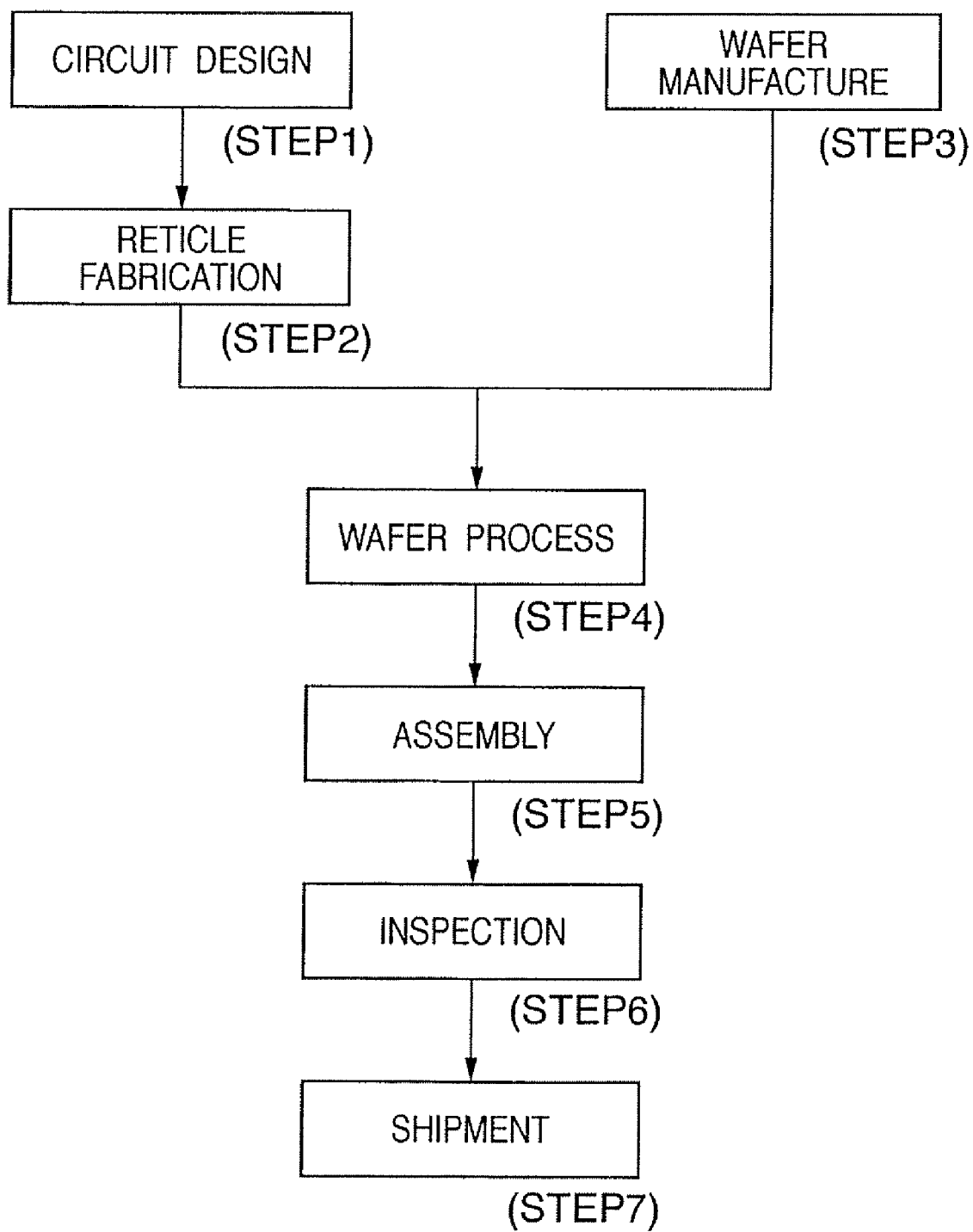
FIG. 14 is a flowchart illustrating the sequence of the overall semiconductor device manufacturing process.

A device manufacturing method using the above-described exposure apparatus will be described next. FIG. 14 is a flowchart illustrating the sequence of the overall semiconductor device manufacturing process. In step 1 (circuit design), the circuit of a semiconductor device is designed. In step 2 (reticle fabrication), a reticle (also called an original or a mask) is fabricated based on the designed circuit pattern. In step 3 (wafer manufacture), a wafer (also called a substrate) is manufactured using a material such as silicon. In step 4 (wafer process), called a pre-process, an actual circuit is formed on the wafer by lithography using the reticle and the wafer. In step 5 (assembly), called a post-process, a semiconductor chip is formed using the wafer manufactured in step 4. This step includes processes such as assembly (dicing and bonding) and packaging (chip encapsulation). In step 6 (inspection), inspections including an operation check test and a durability test of the semiconductor device manufactured in step 5 are performed. A semiconductor device is completed with these processes and shipped, in step 7.

Figure 15:
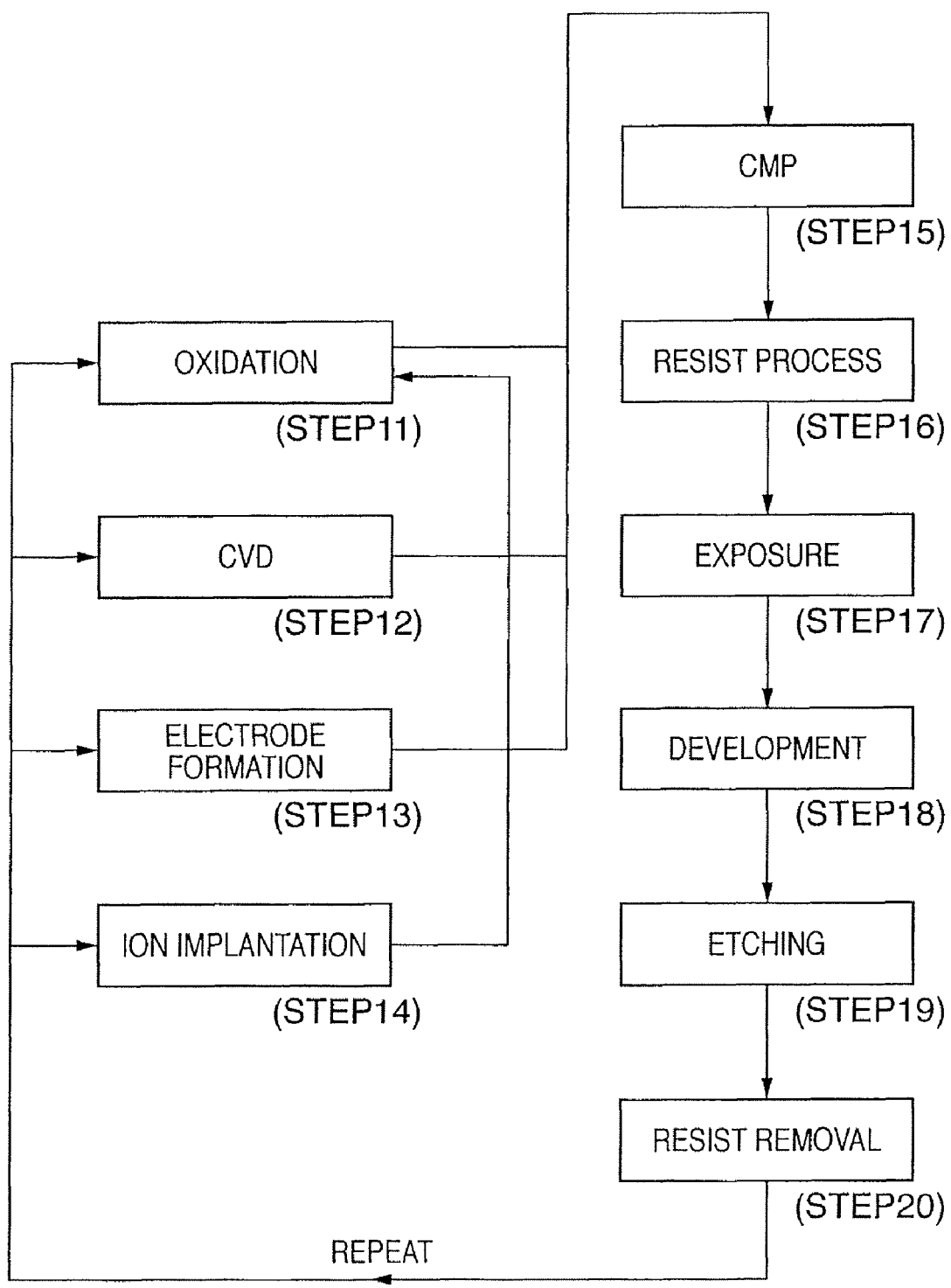
FIG. 15 is a flowchart illustrating the detailed sequence of the wafer process shown in FIG. 14.

FIG. 15 is a flowchart illustrating the detailed sequence of the wafer process. In step 11 (oxidation), the wafer surface is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (CMP), the surface layer on the wafer is planarized by CMP. In step 16 (resist process), a photosensitive agent is applied to the wafer. In step 17 (exposure), the above-described exposure apparatus is used to form a latent image pattern on the resist by exposing the wafer coated with the photosensitive agent to light via the mask on which the circuit pattern is formed. In step 18 (development), the resist transferred onto the wafer is developed to form a resist pattern. In step 19 (etching), the layer or substrate under the resist pattern is etched through a portion where the resist pattern opens. In step 20 (resist removal), any unnecessary resist remaining after etching is removed. By repeating these steps, a multilayered structure of circuit patterns is formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus which comprises an original stage that holds an original, the original stage having a mark thereon, an illumination optical system which illuminates the original held by the original stage, a substrate stage that holds a substrate, and a projection optical system which projects a pattern of the original onto the substrate held by the substrate stage, the apparatus comprising:

an image sensor that receives measurement light and produces an output;

a measurement optical system configured to guide measurement light to obliquely enter the projection optical system, and further to guide the measurement light that is returned from the projection optical system to the image sensor; and a control unit configured to calculate surface position information of the substrate based on the output from the image sensor, wherein the image sensor senses:

(i) an image of the mark arranged on the original stage, the image being formed by the measurement light which emerges from the measurement optical system, is obliquely incident on the mark, passes through the mark and the projection optical system, is obliquely incident on the substrate, is reflected by the substrate, passes through the projection optical system, and returns to the measurement optical system again, and (ii) an image of the mark formed by measurement light which emerges from the measurement optical system, is obliquely incident on the mark, is reflected by the mark, and returns to the measurement optical system again, wherein the control unit calculates the surface position information of the substrate in a direction along an optical axis of the projection optical system, based on an interval between the image of the mark formed by the measurement light which has passed through the mark and the image of the mark formed by the measurement light reflected by the mark.

2. The apparatus according to claim 1, wherein the measurement optical system includes an aperture stop having an opening at a position shifted from an optical axis of the measurement optical system, and the aperture stop regulates the measurement light to obliquely enter the projection optical system.

3. The apparatus according to claim 1, wherein
the substrate is at a position deviated from a focal plane of the projection optical system, and
the measurement light which has passed though the mark passes near the mark while returning from the projection optical system to the measurement optical system.

4. The apparatus according to claim 1, wherein the control unit calculates, as the surface position information, a change in a surface position of the substrate with reference to the mark.

5. The apparatus according to claim 1, wherein a surface shape of the substrate is measured by calculating the surface position information of the substrate on the basis of the output from the image sensor while moving the substrate stage.

6. The apparatus according to claim 5, wherein the surface shape of the substrate is measured while the measurement light is made incident at a first position of the projection optical system, the surface shape of the substrate is measured while the measurement light is made incident at a second position of the projection optical system, and a driving error of the substrate stage in an optical axis direction of the projection optical system is measured on the basis of the two measurement results.

7. The apparatus according to claim 6, further comprising a first TTR (Through The Reticle) detector and a second TTR detector each of which includes the measurement optical system and the image sensor, wherein the first TTR detector measures the surface shape of the substrate while the measurement light is made incident at the first position, and the second TTR detector measures the surface shape of the substrate while the measurement light is made incident at the second position.

8. The apparatus according to claim 1, further comprising a surface position detector configured to detect the surface position information of the substrate by guiding measurement light to be incident on the substrate without the projection optical system and receiving the light reflected by the substrate.

9. A device manufacturing method comprising the steps of:
exposing a substrate using an exposure apparatus defined in claim 1;
developing the substrate exposed in the exposing step; and
processing the substrate developed in the developing step, to manufacture a device.

* * * * *